(12) United States Patent
Matsuda et al.

(10) Patent No.: US 8,058,695 B2
(45) Date of Patent: Nov. 15, 2011

(54) SEMICONDUCTOR DEVICE

(75) Inventors: Tomoko Matsuda, Kanagawa (JP);
Takashi Ide, Kanagawa (JP); Hiroshi Kimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/984,885

(22) Filed: Jan. 5, 2011

(65) Prior Publication Data

US 2011/0095380 A1  Apr. 28, 2011

Related U.S. Application Data

(62) Division of application No. 11/790,747, filed on Apr. 27, 2007, now Pat. No. 7,879,722.

(30) Foreign Application Priority Data

Apr. 28, 2006 (JP) ................... 2006-126085

(51) Int. Cl.
*H01L 29/78* (2006.01)
(52) U.S. Cl. ........... 257/412; 257/E29.255; 438/682
(58) Field of Classification Search ........... 438/682; 257/766, 412
See application file for complete search history.

(56) References Cited

U.S. PATENT DOCUMENTS

| 5,840,626 A | 11/1998 | Ohguro |
| 6,008,124 A * | 12/1999 | Sekiguchi et al. ........... 438/653 |
| 2002/0068444 A1 * | 6/2002 | Bertrand et al. ........... 438/648 |

FOREIGN PATENT DOCUMENTS

| JP | 07-038104 | 2/1995 |
| JP | 9-153616 | 6/1997 |
| JP | 2004-128501 | 4/2004 |
| JP | 2004-172571 | 6/2004 |
| JP | 2004-319592 | 11/2004 |
| JP | 2005-522035 | 7/2005 |

* cited by examiner

*Primary Examiner* — Jarrett Stark
*Assistant Examiner* — Lawrence Tynes, Jr.
(74) *Attorney, Agent, or Firm* — Young & Thompson

(57) ABSTRACT

A semiconductor device includes a silicon substrate, and a NiSi layer provided on the silicon substrate aiming to suppress oxidation of the surface of a NiSi layer and the resistivity increase. The NiSi layer includes a bottom NiSi region and a top NiSi region. The bottom NiSi region provided in contact with silicon surface, and containing substantially no nitrogen. The top NiSi region is a nitrided NiSi region provided in contact with the bottom NiSi region, and containing nitrogen. The NiSi layer has a total thickness of 50 nm or below.

6 Claims, 7 Drawing Sheets

SEMICONDUCTOR DEVICE

This application is based on Japanese patent application no. 2006-126805, the content of which is incorporated hereinto by reference.

BACKGROUND

1. Technical Field

The present invention relates to a semiconductor device having a nickel silicide layer provided on a silicon substrate, and a method of manufacturing the same.

2. Related Art

There are known conventional techniques of forming a nickel silicide layer on a silicon substrate, such as those described in Japanese Laid-Open Patent Publication Nos. 2004-172571, 9-153616, 2004-319592, 2004-128501 and 7-38104.

In the method described in Japanese Laid-Open Patent Publication No. 2004-172571, a nickel-containing, silicide-forming metal film is formed over the surface of a silicon substrate, and thereafter nitrogen gas and titanium source gas are introduced to thereby form an N-rich (nitrogen-rich) titanium film on the silicide-forming metal film. The stack is then annealed at 200 to 700° C. to thereby form a nickel silicide film. According to this document, the method is successful to remove unreacted metal residue on the surface of the field oxide film and on the surface of the sidewall spacer of a transistor, by virtue of the capping N-rich titanium film.

Japanese Laid-Open Patent Publication No. 9-153616 describes that nickel is sputtered in a mixed gas containing nitrogen gas and argon gas, and the sputtering process is followed by annealing at a temperature of 400 to 700° C. for 30 seconds. According to this document, the resultant NiSi film can be nitrided inside the film, by adjusting the nitrogen concentration in the sputtering gas to 5% or around. It is also reported that sputtering Ni with 5% nitrogen concentration was successful in suppressing junction leakage, when the thickness of the Ni film is adjusted to 30 nm, as compared with the case where the nitrogen concentration was 0%.

Japanese Laid-Open Patent Publication No. 2004-319592 describes that the source/drain region of a p-MOS transistor is implanted with Ge ion, before nickel silicide is formed. It is also described that the Ge implantation process is followed by sequential formation of a Ni film of about 10 nm thick and TiN film of about 10 nm, over the surface of the substrate, and annealing at 300 to 600° C. so as to form a Ni monosilicide film having a thickness of about 20 to 25 nm. It is therefore concluded that Ni monosilicide is formed both for the p-MOS transistor and n-MOS transistor, and thereby the variation of the transistor characteristics can be suppressed.

Japanese Laid-Open Patent Publication No. 2004-128501 describes a method to improve adhesion between a nickel silicide layer and a capping silicon nitride layer. According to this document, nickel silicide is formed on a silicon substrate by the two-step annealing process, wherein a Ni film is deposited over the surface of the substrate, the substrate is annealed in a first step at 260 to 310° C., titanium nitride is deposited on the substrate, and then annealed in a second step at 400 to 550° C. In the first step, a nickel-rich alloy is formed, and then the residual nickel is removed. By forming the titanium nitride film thereafter, nitrogen in the titanium nitride film is reportedly fused with the surface of nickel monosilicide in the second step, to thereby protect the underlaid nickel silicide. After the titanium nitride film is removed from the surface of the nickel silicide layer, a silicon nitride capping film is deposited. The silicon nitride film is conventionally used as interlayer isolation film. It is described that the above-mentioned process flow is effective to prevent the formation of a silicon-rich film between the nickel silicide and the silicon nitride film, and thereby the adhesion between the nickel silicide and the silicon nitride film can be improved.

This document also describes that the substrate, having the nickel layer and a titanium nitride capping layer covering the nickel layer formed thereon, is heated up to approximately 290° C., the titanium nitride layer and the residual nickel layer are removed, and the substrate is annealed at around 500° C.

Japanese Laid-Open Patent Publication No. 7-38104 describes consecutive sputtering of Ni and TiN on the surface of a wafer. It is described that the surface of Ni silicide is nitrided by providing TiN on Ni. More specifically, it is shown that nitrogen is contained in Ni silicide in a region thereof deeper than 5 nm from the surface of Ni silicide. Due to the nitride film, a reaction forming insulator film between Ni silicide and oxygen is prevented even if it is heated up to 350° C. in oxygen atmosphere.

In this document, it is also described that a similar effect can be obtained also by two-step annealing after forming the Ni film, and then forming TiN. Temperatures of the two-step annealing are reportedly 300 to 400° C., and 400 to 500° C., respectively.

Although differed in the technical field, Published Japanese Translation of PCT International Publication for Patent Application No. 2005-522035 describes a method of forming cobalt silicide. According to this document, first a cobalt layer is formed on silicon. A titanium nitride layer of 10 to 100 nm thick is formed thereon under nitrogen gas supply, the nitrogen supply is then interrupted, and a titanium layer of 10 to 30 nm is formed. The titanium layer plays a role of a getter layer reactive with oxygen atom or the like, in the succeeding annealing step.

SUMMARY

The present inventors, however, found out from our investigations that abnormal reaction of nickel with silicon tends to occur if the initial annealing temperature during silicidation process is high. Since influences of local failure (abnormal reaction) in the film formation becomes more distinctive with device scaledown advances, it is required to suppress the such local abnormal reaction. It is also desired to lower the process temperature, because thinner silicide film is used in advanced devices and higher process temperature enhances the influence of abnormal reaction in the thinner silicide film on a transistor characteristics.

In this point of view, the above-described Japanese Laid-Open Patent Publication Nos. 2004-172571, 9-153616 and 2004-319592 adopt the single-step annealing after sputtering of the nickel film, whereas Japanese Laid-Open Patent Publication Nos. 2004-128501 and 7-38104 adopt the two-step annealing method with relatively low temperature for initial annealing (1st sintering). The abnormal nickel reaction is supposed to be suppressed, by lowering the first sintering temperature in this way.

On the other hand, lower temperature in the first sintering results in larger amount of $Ni_2Si$ in nickel silicide film just after the first sintering. NiSi is relatively stable against oxidation, whereas $Ni_2Si$ is more susceptible to oxidation. The surface of $Ni_2Si$ is therefore oxidized undesirably by a chemical solution which is used for removing unreacted nickel after the first sintering. Moreover, the $Ni_2Si$ surface is easily oxidized by oxygen in the air. According to examinations by the present inventors, nickel silicide film formed under lower temperatures of the first sintering contains larger amount of Ni$_2$Si, meaning more susceptible to oxidation.

In this point of view, both of Japanese Laid-Open Patent Publication Nos. 2004-128501 and 7-38104 are aimed at suppressing oxidation of nickel silicide, by introducing nitrogen into nickel silicide.

Introduction of nitrogen into nickel silicide, however, increases resistivity of nickel silicide. There is an increasing demand of thinning the nickel silicide layer with device scaledown advances. Investigations by the present inventors found out that increase in the resistivity of the nickel silicide layer due to introduction of nitrogen largely damages characteristics of semiconductor devices, typically for the case where the nickel silicide layer is as thin as 50 nm or below.

Although Japanese Laid-Open Patent Publication No. 2004-128501 illustrated that nickel silicide of several nanometers thick was formed (FIG. 5), the entire portion of the silicide layer are supposedly nitrided, as described later in the embodiments.

In the method described in Japanese Laid-Open Patent Publication No. 7-38104, the nickel silicide layer is nitrided over the region from the surface up to a relatively large depth, so that any trial of adopting this method in formation of a thin silicide layer will result in high resistivity, due to nitiriding up to the region deep inside the silicide layer.

As has been described in the above, any trial of forming a thin nickel silicide layer based on the techniques described in Japanese Laid-Open Patent Publication Nos. 2004-172571, 9-153616, 2004-319592, 2004-128501 and 7-38104 has encountered difficulty in suppressing both the resistivity increase and oxidation of the top surface thereof.

The present inventors extensively investigated the method to suppress both the resistivity increase and oxidation of the top surface of the nickel silicide layer, when it is formed with a thin thickness. As a consequence, it was found that these demands can be satisfied at the same time, by configuring the NiSi layer as having a first region containing substantially no nitrogen, and a second region provided in contact with the first region, and containing nitrogen. The finding led the inventors to propose the present invention.

The configuration of NiSi layer found out in the present invention has been difficult to obtain by any conventional methods. In the present invention, it was further found that the NiSi layer can be nitrided only in the range of a predetermined depth, by forming, in the process of forming the NiSi layer, a predetermined layer structure on the silicon substrate, and by annealing it under predetermined conditions. This point will further specifically be explained in the embodiments and Example later in this specification.

According to the present invention, there is provided a semiconductor device which includes:

a silicon substrate; and a NiSi layer provided on the silicon substrate, wherein the NiSi layer further comprises:

a first region provided as being in contact with the silicon surface, and containing substantially no nitrogen; and a second region provided in contact with the upper portion of the first region, and containing nitrogen, and wherein the NiSi layer has a total thickness of 50 nm or below.

According to the present invention, there is also provided a method of manufacturing a semiconductor device which includes forming a NiSi layer on a silicon substrate, wherein the forming a NiSi layer includes:

a first step forming a Ni film on the silicon of the substrate;

a second step forming a metal nitride film on the Ni film;

a third step annealing the silicon substrate having the metal nitride film provided thereon at a first temperature not lower than 200° C. and not higher than 350° C., so as to react nickel in the Ni film and silicon in the silicon substrate, to thereby form a Ni$_2$Si layer on the silicon of the substrate, and to thereby introduce nitrogen into the Ni$_2$Si layer in the region thereof ranging from the surface to a predetermined depth;

a fourth step, after the third step, selectively removing an unreacted portion of the Ni film; and a fifth step, after the fourth step, annealing the silicon substrate at a second temperature different from the first temperature, so as to form the NiSi layer which comprises a first region containing substantialy no nitrogen, and a second region in contact with the upper portion of the first region, and being nitrided, wherein, in the first step, the Ni film formed on the silicon substrate has a thickness of 10 nm or below.

In the present invention, the NiSi layer is configured as having a thin thickness, and is composed of the first region containing substantialy no nitrogen, and the second region containing nitrogen. By providing second region being as the upper surface of the NiSi layer, and by providing the second region only in the region thereof ranging from the top surface of the NiSi layer to a predetermined depth, oxidation of the surface of the NiSi layer during the process of forming thereof can effectively be suppressed, and also the resistivity increase of the NiSi layer can effectively be suppressed.

It is to be understood that any arbitrary combinations of these configurations, and any exchanges in the expression of the present invention among method, device and so forth, are effective as embodiments of the present invention.

As has been descried in the above, by configuring the NiSi layer having a thickness of 50 nm or below, as having the first region containing substantialy no nitrogen and the second region provided in contact with the upper region of the first region and containing nitrogen, the present invention can suppress both of oxidation of the NiSi surface and the resistivity increase of the NiSi layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
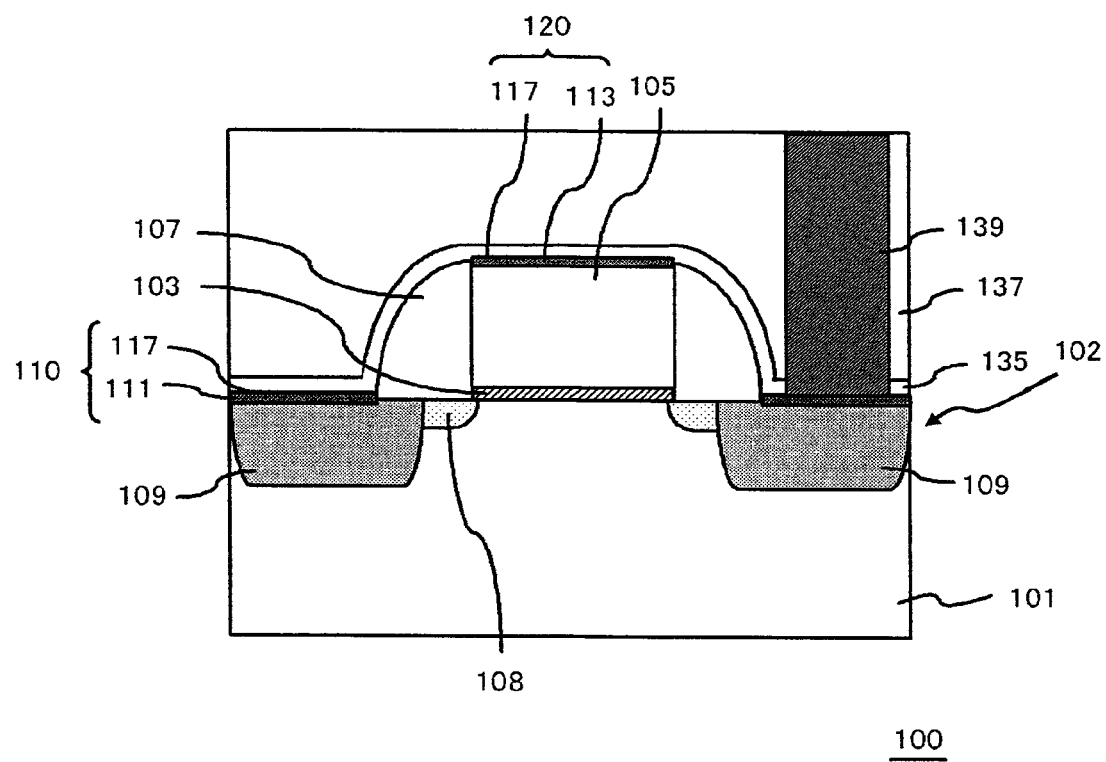
FIG. 1 is a sectional view showing a configuration of a semiconductor device of an embodiment.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will describe embodiments of the present invention referring to the attached drawings. It is to be noted that any common constituents appear in all drawings will be given with the same reference numerals, so as to avoid repetitive explanation.

First Embodiment

FIG. 1 is a sectional view showing a configuration of a semiconductor device of this embodiment.

The semiconductor device 100 shown in FIG. 1 has a silicon substrate 101, and a MOSFET 102 provided on the silicon substrate 101. On the silicon substrate 101 having the MOSFET 102 provided thereto, there are a SiN film 135 and a $SiO_2$ film 137 stacked in this order. In a connection hole penetrating the $SiO_2$ film 137 and the SiN film 135, a connection plug 139 connected to the MOSFET 102 is buried.

The MOSFET 102 includes a pair of source/drain regions 109 and extension regions 108 provided in the upper surficial portion of the silicon substrate 101, a channel region (not shown) formed therebetween, a gate insulating film 103 provided on the channel region, a gate electrode 105 provided on the gate insulating film 103, and sidewalls 107 covering side faces of the gate insulating film 103 and the gate electrode 105.

The gate insulating film 103 is typically an oxide film such as $SiO_2$ film, or an oxynitride film such as $SiOxNy$ film. The description below will explain an exemplary case where the gate insulating film 103 is composed of a $SiO_2$ film. The gate insulating film 103 may also be a high-dielectric-constant film. The high-dielectric-constant film refers to a film having a dielectric constant larger than that of silicon oxide film, to which so-called, high-k film is adoptable. The high-dielectric-constant film may be composed of a material having a dielectric constant of 6 or larger. More specifically, the high-dielectric-constant film may be configured by a material containing either one or both metal elements selected from the group consisting of Hf and Zr, and may be an oxide film, silicate film or the like containing any of these elements.

The gate electrode 105 is typically composed of a silicon-containing, electro-conductive film. The gate electrode 105 is more specifically composed of a policrystalline silicon (polysilicon) film.

The sidewall 107 is composed of an insulating film. Materials applicable to the sidewall 107 may be oxide film such as $SiO_2$ film, and nitride film such as $SiNx$ film. The sidewall 107 is thickened from the top portion of the gate electrode 105 towards the surface of the silicon substrate 101.

The source/drain regions 109 are impurity-diffused (dopant atom diffused) regions functions as the source or the drain of the MOSFET 102.

In the MOSFET 102, a NiSi (nickel monosilicide) layer 120 is provided on the gate electrode 105. A NiSi layer 110 is provided to portions of the source/drain region 109 having no sidewalls 107 formed thereon. A connection plug 139 is provided so as to contact with the upper portion of the NiSi layer 110.

The total thickness of the NiSi layer 110 and the NiSi layer 120 is adjusted typically to 50 nm or below, and more preferably 30 nm or below. This configuration is successful in effectively suppressing junction leakage current in the semiconductor devices in the generation adopting nickel as a material composing the silicide. The total thickness of the NiSi layer 110 and the NiSi layer 120 is typically adjusted to 5 nm or more, and preferably 10 nm or more, from a viewpoint of further effectively suppressing resistivity of the NiSi layer 110 and contact failure with the connection plug 139.

The NiSi layer 110 is provided in contact with the silicon of the silicon substrate 101, and composed of a first region (NiSi region 111) containing substantialy no nitrogen, and a second region (nitrided region 117) provided in contact with the upper portion of the NiSi region 111, and containing nitrogen. The NiSi layer 120 is composed of a NiSi region 113 provided on the gate electrode 105, and containing substantialy no nitrogen, and a nitrided region 117 provided in contact with the upper portion of the NiSi region 113.

The NiSi region 111 and the NiSi region 113 are provided in contact with the source/drain regions 109 and the gate electrode 105, respectively. Both of the NiSi region 111 and the NiSi region 113 are un-nitrided regions containing substantially no nitrogen.

In the region as deep as 2 nm or more from the surface of the NiSi layer 110 towards the silicon substrate 101, the NiSi layer 110 has a nitrogen concentration of 1 at % or less, and more preferably 0.1 at % or less. Also with respect to the NiSi layer 120, in the region as deep as 2 nm or more from the surface of the NiSi layer 120 towards the gate electrode 105 side, the NiSi layer 120 has a nitrogen concentration of 1 at % or less, and more preferably 0.1 at % or less. This configuration can more effectively suppress the resistivity increase of the NiSi layers. The total thickness of the NiSi layer 110 and the NiSi layer 120 is typically 5 nm or more.

From a viewpoint of more effectively suppressing the resistivity increase of the NiSi layer 110 or the NiSi layer 120, the nitrogen concentration of the NiSi layer 110 or the NiSi layer 120, in the region as deep as 2 nm or more from the surface of the NiSi layer 110 or the NiSi layer 120, may be adjusted below the detection limit of the XPS method.

The nitrided region 117 is the top surface region of the NiSi layer 110 and the NiSi layer 120. The nitrided region 117 is a region provided over the range from the surface of the NiSi layer 110 and the NiSi layer 120 to a predetermined depth, and is the region where nitrogen is locally distributed. The NiSi layer 110 and the NiSi layer 120 are nitrided only over the regions ranging from the surface to a predetermined depth so as to produce the nitrided region 117, and the other regions, that are the NiSi region 111 and the NiSi region 113, contain substantialy no nitrogen.

From a viewpoint of effectively suppressing oxidation of the NiSi layer 110 and NiSi layer 120 in the manufacturing process, the nitrogen concentration of the nitrided region 117 is adjusted typically to 2 at % or more, and more preferably 5 at % or more. Although the nitrogen concentration of the nitrided region 117 is not specifically limited, it is adjusted typically to 50 at % or less, and preferably 30 at % or less, from a viewpoint of reducing the contact resistance of the surfaces of the NiSi layer 110 and the NiSi layer 120.

The nitrided region 117 is a region provided in a layer form on the surfaces of the NiSi layer 110 and the NiSi layer 120, and the thickness thereof is adjusted typically to 1 nm or more, and preferably 1.2 nm or more, from a viewpoint of suppressing oxidation of the NiSi layer 110 and the NiSi layer 120 in the process of formation. The thickness of the nitrided region 117 is adjusted typically to 2 nm or below, and preferably 1.8 nm or below, from a viewpoint of suppressing elevation in resistivity of the NiSi layer 110 and the NiSi layer 120. The total thickness of the NiSi layer 110 and the NiSi layer 120 in this case is 5 nm or more, for example.

The nitrogen concentration of the top surface of the NiSi layer 110 and the NiSi layer 120, that is, the nitrogen concentration of the nitrided region 117, and the nitrogen concentration of the NiSi region 111 and the NiSi region 113 can be measured, for example, by the XPS method.

In the configuration having the NiSi layer 110 and the NiSi layer 120 with a total thickness of 50 nm or below, it has been difficult by any conventional methods to provide the nitrided region 117 in the NiSi layer only in a local portion thereof in the vicinity of the top surface.

This embodiment therefore adopts a solution in which, in the process of forming the NiSi layer, a thin Ni film is formed, and a predetermined layer structure is formed on the Ni film, and an annealing temperature and an annealing time well adapted to such structure are properly selected, and two-step annealing (sintering) is carried out. By taking this process, the nitrided region 117 can be provided only to the portion in the vicinity of the top surfaces of the NiSi layer 110 and the NiSi layer 120.

Paragraphs below will explain a method of manufacturing the semiconductor device 100 shown in FIG. 1. FIG. 2A to FIG. 2C, FIG. 3A to FIG. 3C, FIG. 4A, FIG. 4B, FIG. 5A and FIG. 5B are sectional views showing process steps of manufacturing the semiconductor device 100. The semiconductor device 100 can be obtained by forming the MOSFET 102 on the silicon substrate 101.

The process steps of manufacturing the MOSFET 102 include:

a step of forming the gate electrode 105 on the gate insulating film 103 which are formed on the device-forming side of the silicon substrate 101;

a step of forming a sidewall insulating film (sidewall 107) covering the side faces of the gate electrode 105;

a step of forming the source/drain regions 109 in the region of the silicon substrate 101 besides the gate electrode 105; and a step of forming the NiSi layer 110 and the NiSi layer 120 on the silicon substrate 101 specifically on the source/drain regions 109, and on the gate electrode 105, respectively.

Of these, a step of forming the NiSi layer 110 on the silicon substrate 101 is a step of forming the NiSi layer 110a having a thickness of 50 nm or below, and specifically includes the steps below.

Step 101: a Ni film 115 is formed on the silicon surface of the silicon substrate 101 (first step);

Step 102: a metal nitride film (TiN film 119) is formed on the Ni film 115 as being in contact with the upper portion thereof (second step);

Step 103: the silicon substrate 101 having the TiN film 119 provided thereon is annealed at a first temperature not lower than 200° C. and not higher than 350° C., so as to react nickel in the Ni film 115 and silicon in the silicon substrate 101, to thereby form a Ni$_2$Si layer 130 on the silicon substrate 101, and to thereby introduce nitrogen into the Ni$_2$Si layer 130 in the region thereof ranging from the surface to a predetermined depth (third step);

Step 104: after step 103, an unreacted portion of the Ni film 115 is selectively removed (fourth step); and Step 105: after step 104, the silicon substrate 101 is annealed at a second temperature different from the first temperature, so as to form, the NiSi layer 110 which includes the NiSi region 111 containing substantialy no nitrogen, and the nitrided region 117 in contact with the upper portion of the NiSi region 111, and being nitrided (fifth step).

Procedures of manufacturing the semiconductor device 100 will more specifically be explained below, referring to FIG. 2A to FIG. 5B.

Figure 2A:
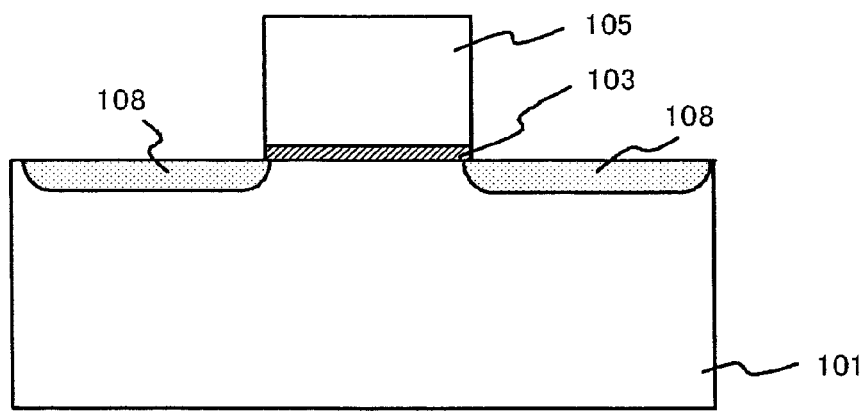
FIGS. 2A to 6D are sectional views showing process steps of manufacturing the semiconductor device shown in FIG. 1.

First, as shown in FIG. 2A, an isolation region (not shown) such as STI (shallow trench isolation) is formed on the silicon substrate 101 having, for example, (100) surface orientation, by a conventional technique. The isolation region may be formed by any other conventional techniques such as the LOCOS (local oxidation of silicon) method. An oxide film is then formed on the silicon substrate 101 by the thermal oxidation process. On the oxide film, a polysilicon film having a thickness of, for example, 50 to 200 nm is formed.

Next, a photoresist film is formed over the silicon substrate 101 so as to cover a region destined for the gate electrode 105. The polysilicon film and the oxide film are selectively removed by dry etching to form the pattern of the gate electrode 105.

The extension regions 108, which destine for an electric connection between the channel region and the source/drain regions 109, are then formed by ion implantation. The gate electrode 105 is used as a mask during the ion implantation (FIG. 2A).

Figure 2B:
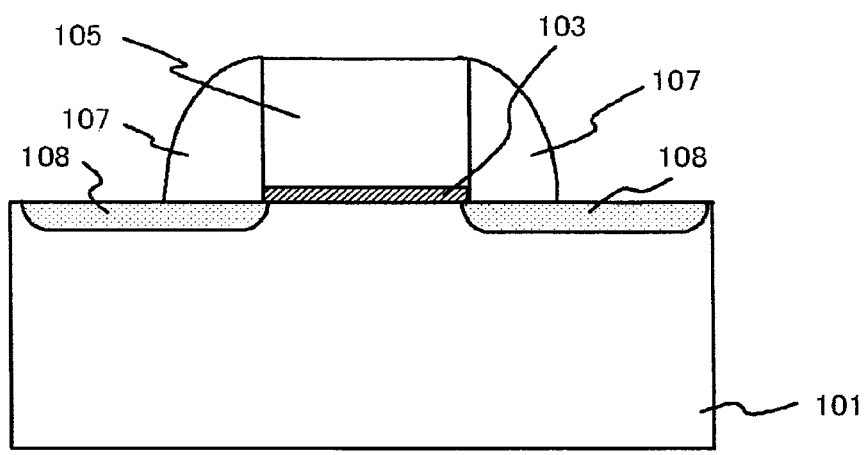

Next, as shown in FIG. 2B, an insulating film destined for the sidewalls 107 is then formed over the silicon substrate 101 by the CVD (chemical vapor deposition) process, so as to cover the gate electrode 105. A material composing the insulating film is, for example, a silicon oxide film or a silicon nitride film. The thickness of the insulating film is typically 10 to 100 nm. The insulating film is then etched back to form the sidewalls 107 on both sides of the gate electrode 105.

Figure 2C:
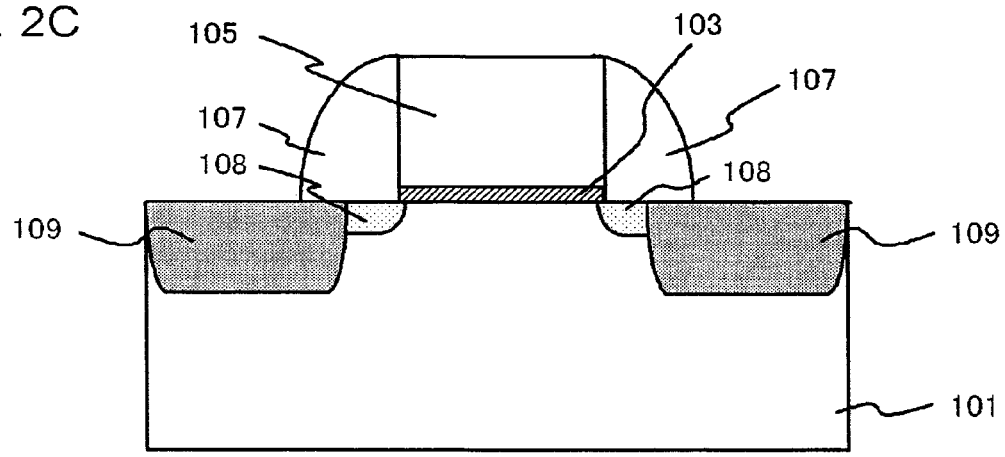

Then as shown in FIG. 2C, an impurity (dopant atom) having the same conductivity type with the impurity (dopant atom) already implanted into the extension region 108 is introduced into the silicon substrate 101 by ion implantation. The gate electrode 105 and the sidewalls 107 are used as masks for ion implantation. By the ion implantation, the source/drain regions 109 deeper than the extension region 108 are formed.

Next, dopant atoms in the source/drain regions 109 are activated by the spike RTA (rapid thermal annealing) process. The highest attainable temperature of the surface of the silicon substrate 101 in the spike RTA is set typically to 1,000 to 1,100° C. Thereafter, the silicon substrate 101 may be subjected to a pretreatment prior to the nickel sputtering. The pretreatment may be cleaning of the surface of the silicon substrate 101, typically using a chemical solution. The cleaning can remove a native oxide film and any foreign materials from the surface of the silicon substrate 101, so that silicide formation on the source/drain regions 109 can further exactly be proceeded.

Next, the NiSi layer 110 and the NiSi layer 120 are formed. FIG. 6A to FIG. 6D are drawings explaining the steps of formatting the NiSi layer 110 and the NiSi layer 120 in further detail. The explanation will be made referring to FIG. 6A to FIG. 6D, as well as FIG. 3A to FIG. 5B.

Figure 3A:
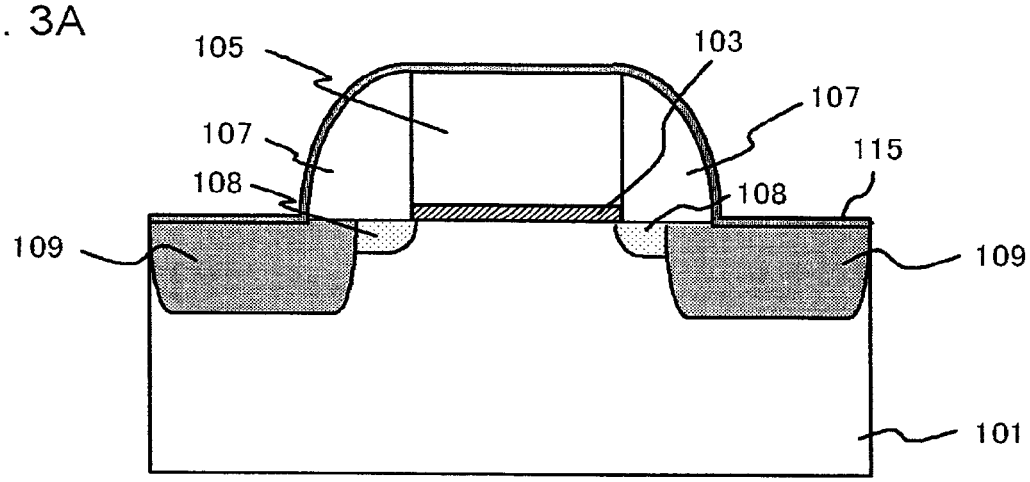

First, as shown in FIG. 3A, the Ni film 115 is formed by sputtering over the silicon substrate 101 (step 101). The Ni film 115 is formed typically by normal-temperature sputtering.

The thickness of the Ni film 115 formed on the silicon substrate 101 in step 101 is adjusted to 10 nm or below, and more specifically around 8 nm, from a viewpoint of further exactly realizing a condition under which the nickel silicidation reaction will be limited by nickel diffusion during the first sintering described later, and from a viewpoint of exact silicidation of the entire portion of the Ni film 115 so as to suppress formation of an oxide layer.

The thickness of the Ni film 115 formed on the silicon substrate 101 is typically 0.05 nm or more, and preferably 5 nm or more. The resistance of the Ni silicide film 120 will increase non-linearly as the Ni film 115 becomes thinner in the region of thickness not thicker than 10 nm. By setting the thickness of the Ni film 115 thicker than 5 nm, the influences of the resistivity increase can further be suppressed to a practically ignorable level.

Figure 3B:
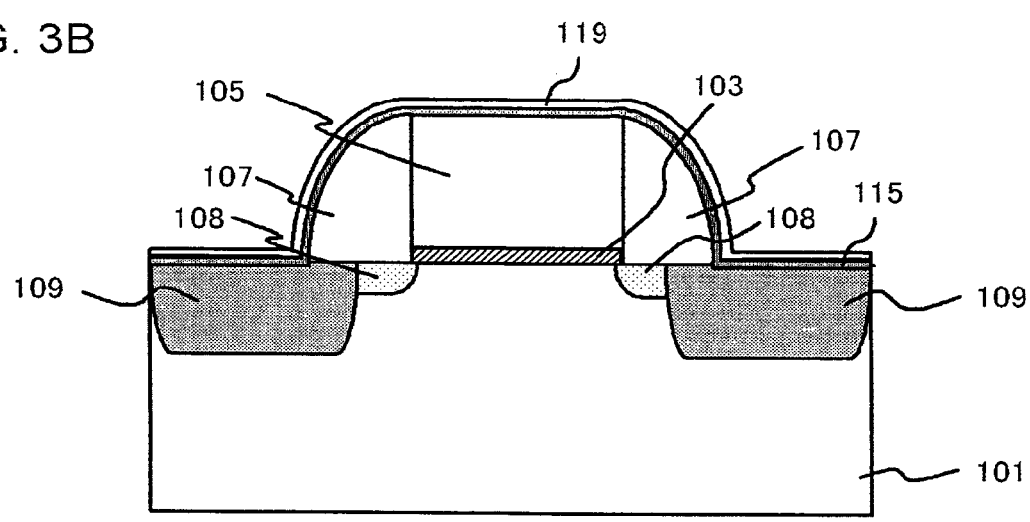
Figure 6A:
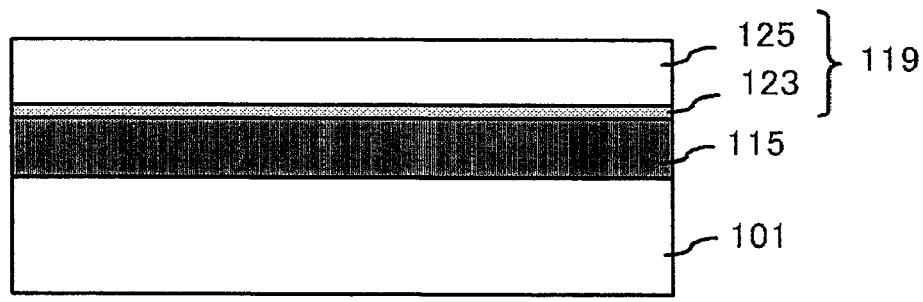

As shown in FIG. 3B and FIG. 6A, the TiN film 119 is formed by sputtering, succeeding to the sputtering for forming the Ni film 115, in order to prevent oxidation of the surface of the Ni film 115 (step 102). In this process, as shown in FIG. 6A, a high-concentration region (high-nitrogen-concentration TiN layer 123) having a nitrogen concentration of typically 80 at % or more is formed over the entire surface of the Ni film 115, and a low-concentration region (low-nitrogen-concentration TiN layer 125) having a nitrogen concentration of typically 60 at % or less is formed in contact with the high-nitrogen-concentration TiN layer 123. In other words, the TiN film 119 has a structure in which the high-nitrogen-concentration TiN layer 123 and the low-nitrogen-concentration TiN layer 125 are stacked in this order from the bottom. The high-nitrogen-concentration TiN layer 123 and the low-nitrogen-concentration TiN layer 125 may successively be formed in the same chamber.

The nitrogen concentration of the high-nitrogen-concentration TiN layer 123 is adjusted typically to 80 at % or more, and preferably 85 at % or more, from a viewpoint of the nitrogen concentration increase at the interface between the TiN film 119 and the Ni film 115. Although the upper limit of the nitrogen concentration of the high-nitrogen-concentration TiN layer 123 is not specifically limited, it is adjusted to 95 at % or less, for example.

On the other hand, the nitrogen concentration of the low-nitrogen-concentration TiN layer 125 is adjusted typically to 5 at % or more, and preferably 10 at % or more, from a viewpoint of further exactly removing the TiN film 119 in the step of removing the TiN film 119 as described later. The nitrogen concentration of the low-nitrogen-concentration TiN layer 125 is adjusted typically to 60 at % or less, and preferably 50 at % or less, from a viewpoint of further exactly forming the nitrided region 117 only in the region ranging from the surfaces of the NiSi layer 110 and NiSi layer 120 to a predetermined depth.

From a viewpoint of exactly forming the nitrided region 117 of a predetermined thickness in the later process, the thickness of the high-nitrogen-concentration TiN layer 123 provided in contact with the upper portion of the Ni film 115 in step 102 is adjusted typically to 0.05 nm or more, and preferably 1 nm or more. From a viewpoint of effectively suppressing the abnormal reaction of nickel with silicon, the thickness of the high-nitrogen-concentration TiN layer 123 is adjusted typically to 3 nm or below, and preferably 2.5 nm or below.

The total thickness of the TiN film 119 is adjusted to 10 nm or around, for example.

The TiN film 119 is formed typically by sputtering Ti with supplying a mixed gas of nitrogen ($N_2$) and argon gas (Ar). An extremely thin high-nitrogen-concentration TiN layer 123 is formed on the surface of the Ni film 115 under conditions relatively high in the nitrogen concentration in a chamber for producing the TiN film 119, and relatively high in the sputtering energy, and the low-nitrogen-concentration TiN layer 125 of a predetermined thickness is then formed under conditions relatively low in the nitrogen concentration in the chamber, and relatively low in the sputtering energy.

The conditions of forming the high-nitrogen-concentration TiN layer 123 typically include a ratio of nitrogen gas of not less than 80 vol % and not more than 90 vol % in the total volume gas, and a sputtering power of not less than 2 kW and not more than 20 kW, for example. The sputtering time can appropriately be set depending on the sputtering power, and can be typically 1 to 60 seconds. More specifically, the sputtering is carried out at a sputtering power of 10 to 15 kW for approximately 5 to 15 seconds. Sputtering for a short duration of time under the conditions relatively high in the nitrogen concentration in the chamber and relatively high in the sputtering energy, makes it possible to increase the nitrogen concentration of the high-nitrogen-concentration TiN layer 123 to a satisfactory level, and to decrease thickness of the high-nitrogen-concentration TiN layer 123.

The conditions for forming the low-nitrogen-concentration TiN layer 125 typically include a ratio of nitrogen gas of 40 vol % to 60 vol % in the total volume gas, and more specifically around 50 vol %, and a sputtering power of not less than 0.5 kW and not more than 3 kW. The sputtering time can appropriately be set depending on the sputtering power, and can be typically 1 to 60 seconds. More specifically, the sputtering is carried out at a sputtering power of 1 to 2 kW for approximately 30 to 60 seconds. Sputtering for a certain duration of time under the conditions relatively low in the nitrogen concentration in the chamber and relatively low in the sputtering energy, makes it possible to improve accuracy of the thickness of the low-nitrogen-concentration TiN layer 125.

In this embodiment, by allowing nitrogen to reside also in the low-nitrogen-concentration TiN layer 125 at a low concentration, the TiN film 119 can further exactly be removed in the step of removing the TiN film 119 (step 104) described later, even if Ti in the high-nitrogen-concentration TiN layer 123 is oxidized in the configuration of a second embodiment described later. In this point of view, too small ratio of nitrogen gas during the formation of the low-nitrogen-concentration TiN layer 125 makes the high-nitrogen-concentration TiN layer 123 almost a Ti layer, so that for the purpose of improving stability in production of the low-nitrogen-concentration TiN layer 125 containing a low concentration of nitrogen, the ratio of nitrogen gas to the total volume of nitrogen gas and argon gas is adjusted to 40 vol % or more, and preferably 50 vol % or more.

Thereafter, two-step sintering is carried out.

Figure 3C:
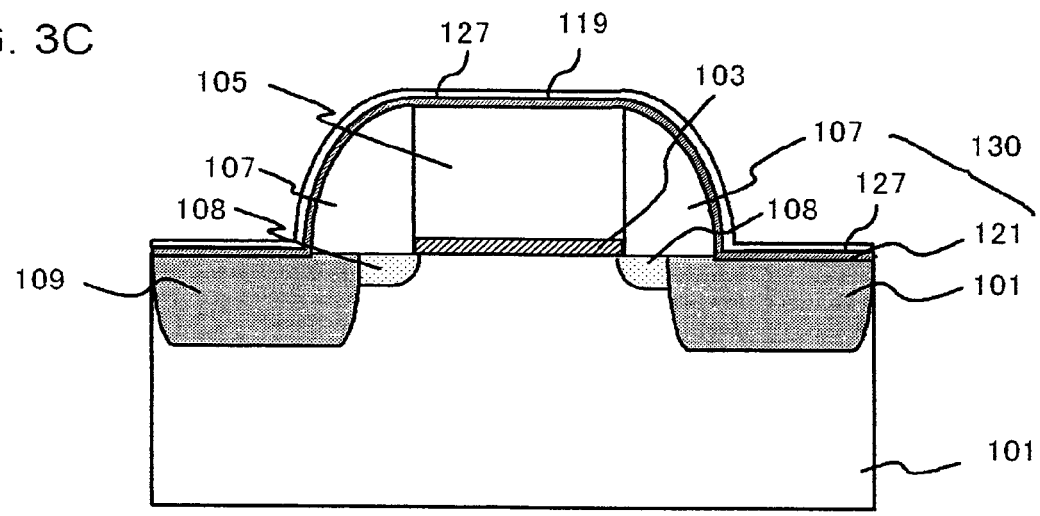
Figure 6B:
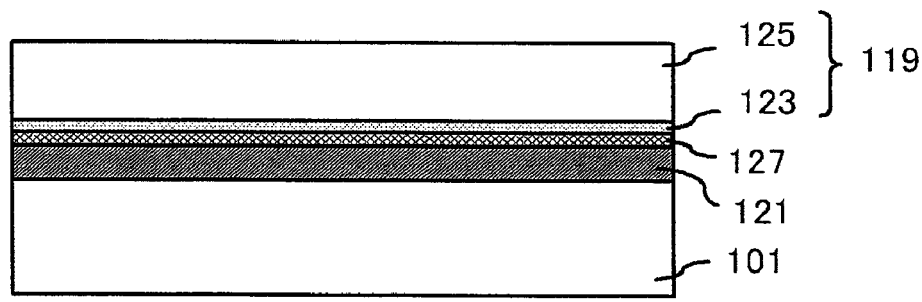

First, as shown in FIG. 3C and FIG. 6B, a first sintering of the silicon substrate 101 having the Ni film 115 and the TiN film 119 formed thereon is carried out (step 103). In the first sintering, the silicon substrate 101 is heated at a first temperature from not lower than 200° C. and not hither than 350° C.

From a viewpoint of further exactly forming $Ni_2Si$ film to a thickness necessary for forming a predetermined thickness of NiSi layer 110, the annealing time of the first sintering is set to one second or longer, and preferably 30 seconds or longer. From a viewpoint of forming the nitrided region 127 only to the surficial portion of the $Ni_2Si$ layer 130, and suppressing increase in the thickness, the annealing time of the first sintering is set to 300 seconds or shorter, and preferably 100 seconds or shorter. More specific annealing conditions relate to 290 to 300° C., and 60 seconds, for example.

In the first sintering, nitrogen is diffused into the Ni film 115, and silicon in the silicon substrate 101 and nickel in the Ni film 115 are allowed to react to thereby produce the $Ni_2Si$ layer 130 as a metastable Ni silicide. The $Ni_2Si$ layer 130 is obtained as a stack which is composed of a $Ni_2Si$ region 121 formed on the source/drain regions 109 and a nitrided region 127 formed in contact with the upper portion of the $Ni_2Si$ region 121.

Because the high-nitrogen-concentration TiN layer 123 herein is formed only in the vicinity of the interface between the TiN film 119 and the Ni film 115, increase in the film stress of the TiN film 119 as a whole can be suppressed. The abnormal reaction of nickel during the first sintering can thus be suppressed.

By forming the TiN film 119 composed of the high-nitrogen-concentration TiN layer 123 and the low-nitrogen-concentration TiN layer 125, and by carrying out the first sintering under the above-described annealing conditions, the $Ni_2Si$ layer 130 can be formed under a condition characterized in that the rate of supply of nickel is slower than the rate of reaction between nickel and silicon, that is, a condition under which nickel silicidation will be limited by nickel diffusion. In this way, the Ni$_2$Si layer 130 of a predetermined thickness can be formed in a stable manner, and nitrogen can be supplied only to the surface thereof.

By adjusting the thickness of the Ni film 115 to 10 nm or below, and by adopting a condition under which nickel silicidation will be limited by nickel diffusion, the entire portion of the Ni film 115 can be silicided and unreacted portion of the Ni film 115 does not remain on the silicon area. It is therefore made possible to effectively suppress formation of an oxide layer which will be described later referring to FIG. 7A to FIG. 7C.

Examples of sintering gas used for the first sintering include inert gas such as nitrogen gas, argon gas, helium gas and the like. Of these, use of nitrogen gas allows further exact formation of the nitrided region 127.

Although the structure of the nitrided region 127 is not exactly clarified at present, nitrogen is supposed to bind with silicon in Ni$_2$Si.

Figure 4A:
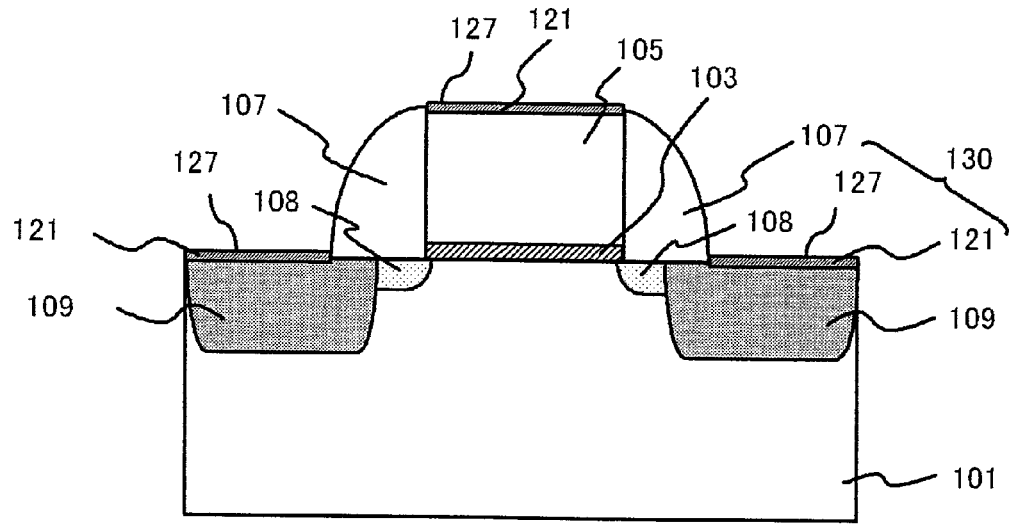
Figure 6C:
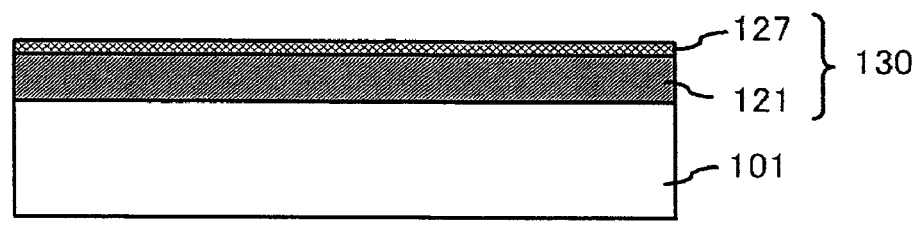

Next, as shown in FIG. 4A and FIG. 6C, the TiN film 119 and the non-reacted portion of the Ni film 115 are removed by wet etching (step 104). The etching solution adopted herein is SPM (sulfuric acid/hydrogen peroxide mixture), for example. Etching conditions include 140° C., and 2 minutes, for example. For the case adopting SPM, higher etching temperature is more causative of the Ni$_2$Si layer oxidation. Therefore, from a viewpoint of the effective oxidation suppression, the etching temperature is adjusted typically to 200° C. or below, and preferably 150° C. or below.

As a consequence, the stratiform nitrided region 127 is exposed. According to examinations by the present inventors, nitridation in the nickel silicide layer mainly proceeds during the first sintering process, but hardly proceeds in the second sintering or thereafter described later. The thickness of the nitrided region 127 in the resultant Ni$_2$Si layer 130 can be adjusted corresponding to the thickness of the nitrided region 117, typically 1 nm or more and 2 nm or below.

Figure 4B:
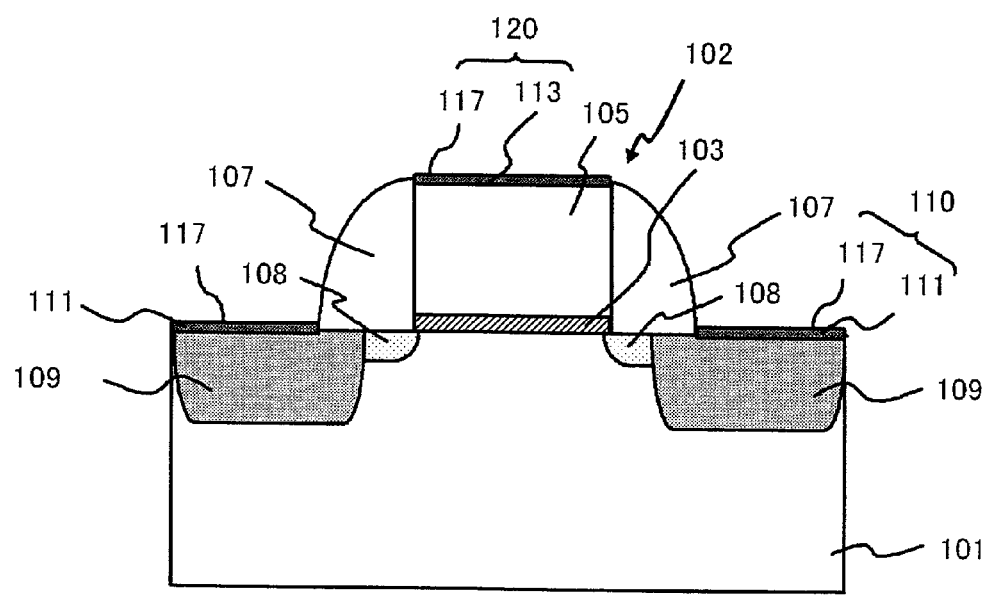
Figure 6D:
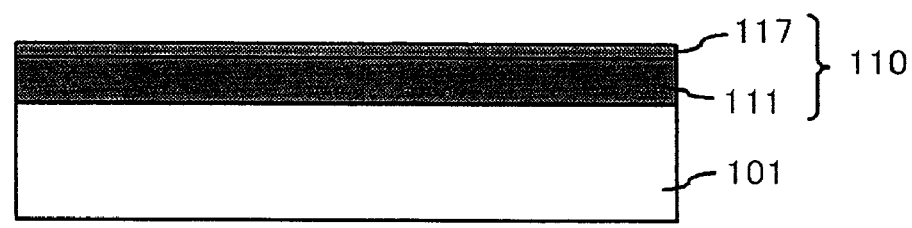

Thereafter, as shown in FIG. 4B and FIG. 6D, the silicon substrate 101 is annealed at a predetermined second temperature as the second sintering, so as to convert Ni$_2$Si into more stable NiSi, and thereby the NiSi layer 110 and the NiSi layer 120 having a total thickness of 50 nm or below are formed (step 105). Also in this stage, top surface of the NiSi layer 110 and the NiSi layer 120 are kept in the nitrided state, giving the nitrided region 117. More specifically, the NiSi layer 110 and the NiSi layer 120 having a total thickness of 5 nm or more are formed, and the nitrided region 117 having a thickness of 1 nm or more and 2 nm or below is formed.

Although the structure of the nitrided region 117 is not exactly clarified, nitrogen atom is supposed to bind with silicon atom in NiSi.

The temperature of the second sintering is set higher than the temperature of the first sintering, and is more specifically set to 370 to 500° C. By the procedures described in the above, the MOSFET 102 shown in FIG. 1 can be obtained.

Figure 5A:
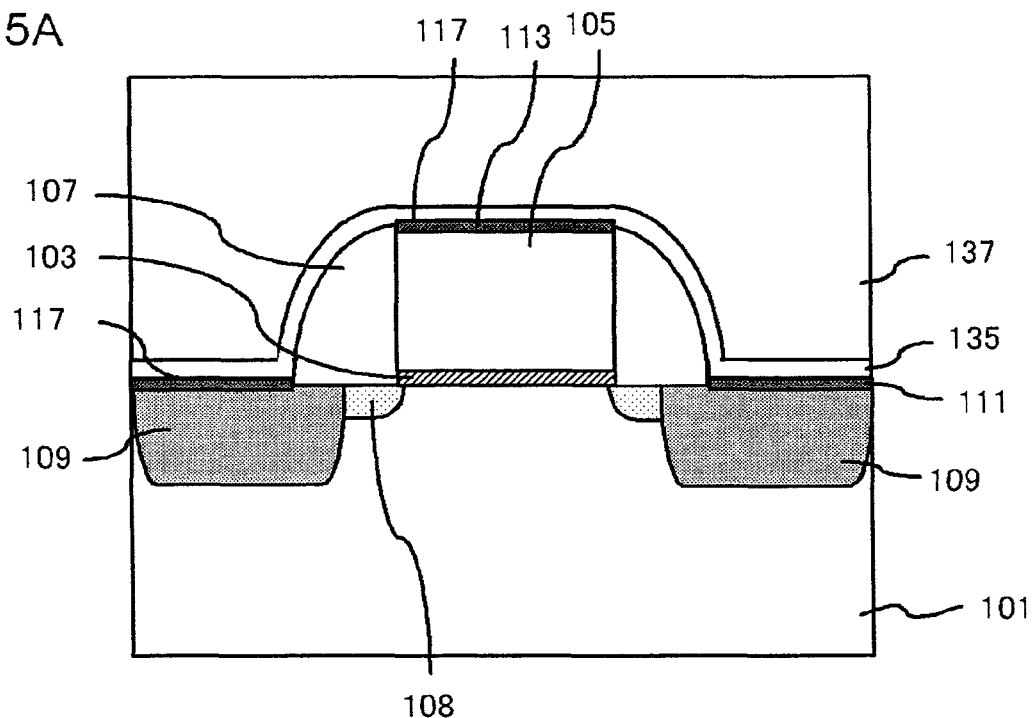

Thereafter, as shown in FIG. 5A, on the silicon substrate 101 having the MOSFET 102 already formed thereon, the SiN film 135 which acts as an etching stopper film and the SiO$_2$ film 137 respectively having a predetermined thickness are sequentially formed, so as to form the insulating interlayer having these films stacked therein.

Figure 5B:
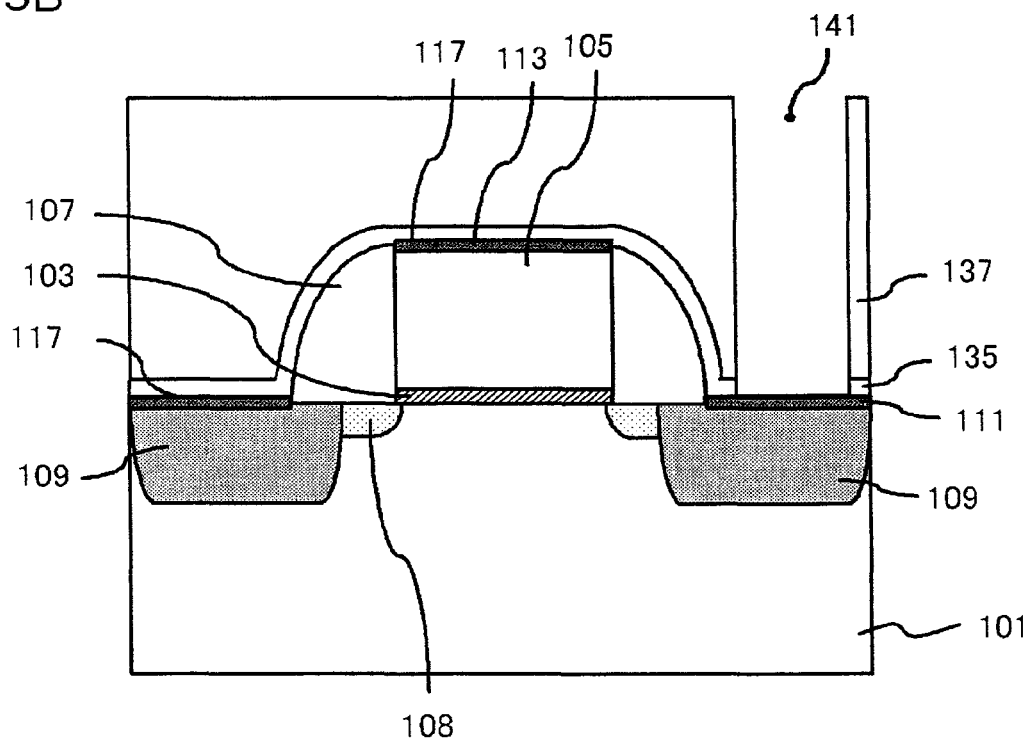

Portions of the SiN film 135 and the SiO$_2$ film 137 are then selectively removed as shown in FIG. 5B, in the region where the NiSi layer 110 was formed, so as to form a via-hole 141, and the surface of the NiSi layer 110 is exposed at the bottom of the via-hole 141.

Next, a barrier metal film (not shown) and an electrically conductive film are sequentially formed so as to fill the via-hole 141, and the portions of the barrier metal film and the electrically conductive film formed outside the via-hole 141 are removed, to thereby form the connection plug 139. By these procedures, the semiconductor device 100 shown in FIG. 1 is obtained.

Although layers above the SiO$_2$ film 137 were not shown in FIG. 1, it is also allowable, after the above-described procedures, to further stack the insulating interlayer on the SiO$_2$ film 137, and to carry out multilayered interconnection forming processes.

In this embodiment, the nitrided region 117 is provided only to the topmost surfaces of the NiSi layer 110 and the NiSi layer 120, and the NiSi region 111 and the NiSi region 113 contain substantialy no nitrogen. Because the NiSi region 111 and the NiSi region 113, composing the regions other than the topmost surfaces, contain substantialy no nitrogen, the resistivity increase of the NiSi layer 110 and the NiSi layer 120 are successfully suppressed.

The present inventors found out from the investigations that thinning of the Ni film formed on silicon to as thin as 10 nm or below, aiming at thinning the final film thickness of the NiSi layer, sometimes made the reaction between Ni and Si hard to proceed, due to the film thinning effect.

Therefore in this embodiment, the annealing time in the first sintering is adjusted to 1 second or longer, and preferably 30 seconds or longer.

By this adjustment, the reaction between Ni and Si is allowed to proceed in a more exact manner even when the Ni film 115 is thin, and thereby almost entire portion of the resultant Ni film 115 can be silicided.

By using the structure that the topmost surfaces of the NiSi layer 110 and the NiSi layer 120 contain a high concentration of nitrogen and also using the silicidation process converting the entire portion of the Ni film to silicide, oxidation of the nickel silicide surface can be suppressed even when Ni$_2$Si layer 130, which is easily oxidized, is exposed during formation process of NiSi layer 110 and the NiSi layer 120.

In the first sintering, under the condition that the silicidation is limited by the reaction between nickel and silicon, a large amount of nitrogen atoms are introduced into the Ni film 115 contacting with the surficial TiN film 119, and the residual un-reacted Ni film 115 becomes thick. As a result, residual thick un-reacted Ni film 115 is removed and the Ni$_2$Si region 121 having a low nitrogen concentration is exposed in step 104. In contrast, by adopting a condition that the silicidation is limited by the nickel diffusion, introduction of nitrogen and the reaction of forming the Ni$_2$Si layer 130 will be balanced to an improved degree, and the Ni$_2$Si layer 130 including the nitrided region 127 can be formed only at the top surface in a further stabilized manner.

Paragraphs below will describe the oxidation process possibly proceeds when the top surface of the Ni$_2$Si layer 130 is not nitrided, referring to FIG. 7A to FIG. 7C.

Figure 7A:
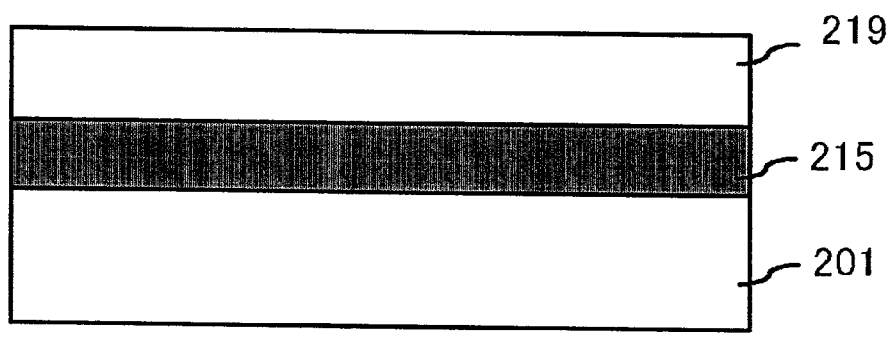
FIGS. 7A to 7C are sectional views showing process steps of manufacturing the silicide layer of the semiconductor device in the embodiment.
Figure 7B:
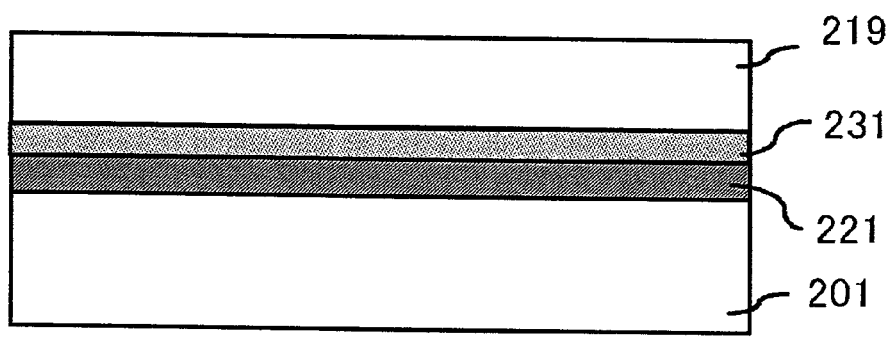
Figure 7C:
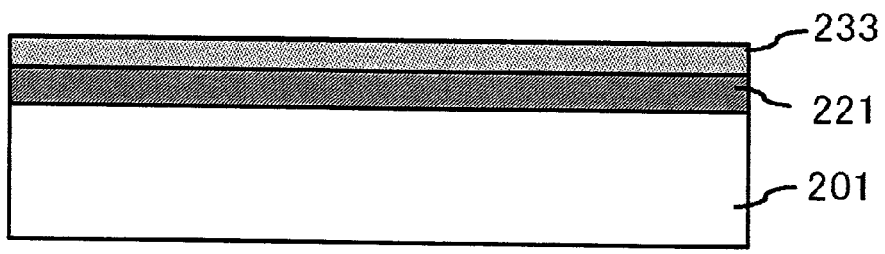

As shown in FIG. 7A, a Ni film 215 and a TiN film 219 are stacked in this order on a silicon substrate 201. The first sintering is carried out under the condition that the silicidation is limited by the nickel diffusion. According to thorough investigations by the present inventors, the annealing in this case results in, as shown in FIG. 7B, formation of a Ni$_2$Si layer 221, and a Ni$_{31}$Si$_{12}$ layer 231 formed thereon, having a larger nickel content. The Ni$_{31}$Si$_{12}$ layer 231 is more susceptible to oxidation than the Ni$_2$Si layer 221, and is oxidized in the process of removing the TiN film 219, to thereby form a SiOx layer 233 on the Ni$_2$Si layer 221 (FIG. 7C).

Formation of the SiOx layer 233 is causative of failure in formation of the connection plug 139. For example in formation process of the connection plug 139, as the design rule shrinks, process margin in a step of forming the via-hole 141 in the $SiO_2$ film 137 becomes more stringent, from a viewpoint of preventing leakage at common contact regions due to erosion of the sidewalls 107. For this reason, formation of the SiOx layer 233 may be causative of failure in connection between the connection plug 139 and the NiSi layer 110.

In contrast in this embodiment, formation of the SiOx layer 233 can effectively be suppressed by composing the top surface of the $Ni_2Si$ layer 130 with the nitrided region 127, forming the Ni film 115 of 10 nm or thinner, carrying out the first sintering under the condition that the silicidation is limited by the nickel diffusion, and thereby siliciding almost entire portion of the Ni film 115. As a consequence, failure in formation process of the connection plug 139 can be suppressed.

In this embodiment, the annealing for silicidation is carried out in two steps of the first sintering and the second sintering, wherein in the first sintering, the annealing temperature is set to as low as 200° C. to 350° C., both ends inclusive. As a consequence, the local abnormal reaction between nickel in the Ni film 115 and silicon in the silicon substrate 101 can be suppressed, and stability in production of the MOSFET 102 can be improved. Because the abnormal reaction can be suppressed, junction leakage can also be suppressed even for the case where a shallow junction is adopted in the MOSFET 102, and thereby the yield of production of the MOSFET 102 can be improved.

Moreover in this embodiment, formation of the nitrided region 117 effectively suppresses oxidation of the surface of the $Ni_2Si$ layer 130, even when the first sintering temperature is low under which the oxidation reaction is likely to proceed. In addition, because the nitrided region 117 is selectively provided only in the surficial portions of the NiSi layer 110 and the NiSi layer 120, the resistivity increase of these NiSi layers are effectively suppressed, even when the total thickness of the NiSi layer 110 and the NiSi layer 120 was adjusted to as small as 50 nm or below. As has been described in the above, according to this embodiment, the MOSFET 102 showing excellent characteristics can be manufactured in a stable manner with the high production yield.

The embodiment below will be explained, featuring points different from those in the first embodiment.

Second Embodiment

The first embodiment has explained the case where the TiN film 119 was composed of the stack of the high-nitrogen-concentration TiN layer 123 and the low-nitrogen-concentration TiN layer 125 (FIG. 5A). The TiN film 119 may be configured also as described below.

More specifically, it is good enough for the TiN film 119 that the high-nitrogen-concentration TiN layer 123 is provided selectively at the interface with the Ni film 115, wherein the upper portion of the high-nitrogen-concentration TiN layer 123 may contain no nitrogen. For example, a Ti layer can be stacked on the high-nitrogen-concentration TiN layer 123.

Because the high-nitrogen-concentration TiN layer 123 is provided in contact with the Ni film 115 also in this case, effects similar to those in the first embodiment can be obtained.

Paragraphs in the above have described the embodiments of the present invention referring to the attached drawings only for exemplary purposes, allowing adoption of various configurations other than those shown in the above.

For example, the embodiments in the above have described the cases where the high-nitrogen-concentration TiN layer 123 was provided only at the bottom of the TiN film 119, as the method of selectively forming the nitrided region 117 in the top surface portions of the NiSi layer 110 and the NiSi layer 120. However, it is to be noted, in the process of forming the NiSi layer 110 and the NiSi layer 120, that the conditions such as the thickness of the sputtered nickel film, the first sintering temperature, the first sintering time, composition of TiN and so forth may be any of those capable of forming the nitrided region 117 in the region ranging from the top surface to a predetermined depth in the NiSi layer 110 and the NiSi layer 120, and can be set, as typically described in the first embodiment in the above, to a condition under that the silicidation is limited by the nickel diffusion.

The above-described embodiments adopted polysilicon as a material composing the gate electrode 105. However, the material composing the gate electrode 105 is not limited thereto, allowing use of various materials. In the above-described embodiments, silicon resides also on the surface of the gate electrode 105, so that the thin NiSi layer 120 can be formed not only on the source/drain region 109, but also on the gate electrode 105, and both the resistivity increase and oxidation can effectively be suppressed.

EXAMPLE

In this Example, the semiconductor device 100 (FIG. 1) was manufactured adopting the method described in the first embodiment. A material composing the sidewalls 107 selected herein was $SiO_2$ film. The NiSi layer 110 and the NiSi layer 120 were formed according to the conditions below.

Ni film 115: normal-temperature sputtering, thickness=8 nm;
TiN film 119: normal-temperature sputtering, thickness=10 nm;
High-nitrogen-concentration TiN layer 123: $Ar:N_2$=10:90, 12 kW, 10 seconds;
Low-nitrogen-concentration TiN layer 125: $Ar:N_2$=50:50, 2 kW, 30 seconds;
First sintering temperature: 300° C., 60 seconds; Etching for removing unreacted Ni film 115: SPM, 140° C., 2 minutes; and
Second sintering temperature: 450° C., 30 seconds.

The total thickness of the resultant NiSi layer 110 was found to be about 20 nm. It was also found that the nitrided region 117 was formed as deep as 2 nm or around from the surface of the NiSi layer 110.

The nitrogen concentration of the nitrided region 117 measured by the XPS method was found to be 3 at %. The nitrogen concentration at 6 nm depth from the surface of the NiSi layer 110, measured by the XPS method, was found to be less than the detection limit.

Based on these findings, the NiSi layer 110 is supposed to have a stacked structure of the NiSi region 111 containing substantialy no nitrogen, and a nitrided region 117.

Sheet resistance value of the NiSi layer 110 obtained in this example was found to be 15 ohm/sq. In this example, the connection plug 139 could be formed so as to contact with the NiSi layer 110 in a stable manner. The connection plug 139 herein was a tungsten plug, and materials composing the barrier metal film of the connection plug 139 was Ti (upper layer)/TiN (lower layer).

REFERENCE EXAMPLE

The TiN film 119 formed in Example was altered so that the entire portion thereof is composed of the high-nitrogen-concentration TiN layer 123. Sputtering conditions for forming the high-nitrogen-concentration TiN layer 123 include Ar:$N_2$=20:80, 2 kW, and 30 seconds or around. Except for these conditions, the semiconductor device was manufactured according to the conditions in Example.

The total thickness of thus-obtained NiSi layer was approximately 20 nm. The NiSi layer was found as being nitrided over the entire portion thereof. Measurement of the nitrogen concentration at the portion 6 nm deep from the surface, based on the XPS method, was found to be 5 at %.

The sheet resistance of the NiSi layer obtained in Reference Example was found to be 50 ohm/sq.

It is apparent that the present invention is not limited to the above embodiment, that may be modified and changed without departing from the scope and spirit of the invention.

What is claimed is:

1. A semiconductor device, comprising:
    a silicon layer;
    a first silicide layer containing nickel provided on the silicon layer; and
    a second silicide layer containing nickel provided on the first silicide layer,
    wherein said second silicide layer has a nitrogen concentration greater than a nitrogen concentration of said first silicide layer.

2. The semiconductor device according to claim 1, wherein said first silicide layer is formed between and directly contacts said silicon layer and said second silicide layer.

3. The semiconductor device according to claim 2, wherein said silicon layer comprises a gate electrode and source/drain regions.

4. The semiconductor device according to claim 1, wherein the nitrogen concentration of said first silicide layer is substantially zero.

5. The semiconductor device according to claim 1, wherein a thickness of said second silicide layer is less than a thickness of said first silicide layer.

6. The semiconductor device according to claim 1, wherein the nitrogen concentration of said first silicide layer is 1 at% or less and the nitrogen concentration of said second silicide layer is 2 at% or more.

* * * * *